United States Patent
Hino et al.

(10) Patent No.: US 9,893,228 B2
(45) Date of Patent: Feb. 13, 2018

(54) METHOD FOR MANUFACTURING COMPOUND SEMICONDUCTOR SOLAR CELL

(71) Applicant: KANEKA CORPORATION, Osaka-shi, Osaka (JP)

(72) Inventors: Masashi Hino, Settsu (JP); Mitsuru Ichikawa, Settsu (JP); Tomomi Meguro, Settsu (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/126,995

(22) PCT Filed: Mar. 25, 2015

(86) PCT No.: PCT/JP2015/059256
§ 371 (c)(1),
(2) Date: Sep. 16, 2016

(87) PCT Pub. No.: WO2015/147106
PCT Pub. Date: Oct. 1, 2015

(65) Prior Publication Data
US 2017/0110620 A1 Apr. 20, 2017

(30) Foreign Application Priority Data
Mar. 25, 2014 (JP) .................. 2014-062617

(51) Int. Cl.
*H01L 31/18* (2006.01)
*H01L 31/0392* (2006.01)
(52) U.S. Cl.
CPC ........ *H01L 31/18* (2013.01); *H01L 31/03923* (2013.01); *H01L 31/03928* (2013.01); *H01L 31/1892* (2013.01)

(58) Field of Classification Search
None
See application file for complete search history.

(56) References Cited

U.S. PATENT DOCUMENTS 5,356,656 A * 10/1994 Kuo .................. B05D 7/24
136/245
2007/0215195 A1 9/2007 Buller et al.
(Continued)

FOREIGN PATENT DOCUMENTS

JP H05315630 A 11/1993
JP 2003179238 A 6/2003
(Continued)

OTHER PUBLICATIONS

Ishizuka et al., "Efficiency Enhancement of Cu(In,Ga)Se2 Solar Cells Fabricated on Flexible Polyimide Substrates using Alkali-Silicate Glass Thin Layers", Published Sep. 12, 2008, The Japan Society of Applied Physics.*
(Continued)

*Primary Examiner* — Andres Munoz
(74) *Attorney, Agent, or Firm* — Alleman Hall Creasman & Tuttle LLP

(57) ABSTRACT

A solar cell includes a metal layer and a chalcopyrite compound semiconductor layer in this order on a polyimide film. A manufacturing method according to the present invention includes the following steps in the order: cast applying a polyimide precursor solution onto a support base containing an alkali metal; imidizing the polyimide precursor by heating to form a stacked body including a polyimide film on the support base; forming a metal layer on the polyimide film of the stacked body; and forming a chalcopyrite compound semiconductor layer on the metal layer.

10 Claims, 3 Drawing Sheets

(56) References Cited

U.S. PATENT DOCUMENTS

| | | | |
|---|---|---|---|
| 2008/0261060 A1* | 10/2008 | Yamaguchi | C08G 73/101 428/458 |
| 2011/0023963 A1 | 2/2011 | Ishizuka et al. | |
| 2011/0079277 A1 | 4/2011 | Shimokawa et al. | |
| 2011/0254116 A1* | 10/2011 | Matsuhima | H01L 31/0481 257/443 |
| 2013/0255760 A1 | 10/2013 | Kim | |
| 2014/0042662 A1 | 2/2014 | Tamada et al. | |
| 2015/0125665 A1* | 5/2015 | Nakase | B32B 37/12 428/172 |
| 2015/0136209 A1* | 5/2015 | Hattori | H01L 31/03926 136/252 |
| 2015/0368402 A1* | 12/2015 | Akinaga | B32B 27/08 428/220 |
| 2016/0071989 A1* | 3/2016 | Han | H01L 31/03926 136/252 |

FOREIGN PATENT DOCUMENTS

| | | | | |
|---|---|---|---|---|
| JP | 2010202729 A | 9/2010 | | |
| JP | 2011077074 A | 4/2011 | | |
| JP | 2012233083 A | 11/2012 | | |
| JP | WO 2013191052 A1 * | 12/2013 | | H05K 3/007 |
| JP | WO 2014123045 A1 * | 8/2014 | | B32B 27/08 |
| WO | 2009116626 A1 | 9/2009 | | |
| WO | 2009142244 A1 | 11/2009 | | |

OTHER PUBLICATIONS

International Bureau of WIPO, International Preliminary Report on Patentability Issued in Application No. PCT/JP2015/059256, Oct. 6, 2016, WIPO, 9 pages.

ISA Japan Patent Office, International Search Report Issued in Application No. PCT/JP2015/059256, Jun. 2, 2015, WIPO, 4 pages.

* cited by examiner

US 9,893,228 B2

METHOD FOR MANUFACTURING COMPOUND SEMICONDUCTOR SOLAR CELL

TECHNICAL FIELD

The present invention relates to a method for manufacturing a compound semiconductor solar cell using a chalcopyrite compound semiconductor.

BACKGROUND ART

Solar cells using a chalcopyrite compound semiconductor such as CIS or CIGS have the highest conversion efficiency in thin-film solar cells, and are extensively studied. It is known that in a chalcopyrite compound semiconductor solar cell, an alkali metal is added to a compound semiconductor layer to improve conversion efficiency (so called an "alkali effect").

For example, when a compound semiconductor solar cell including a metal layer and a compound semiconductor layer on a glass substrate is prepared, use of a soda lime glass as a substrate can enhance efficiency because sodium atoms are diffused into the compound semiconductor layer through the metal layer from the soda lime glass.

On the other hand, there is growing interest in compound semiconductor solar cells using a film substrate in terms of weight reduction and flexibility. Since CIS and CIGS are formed at a high temperature, a film substrate is required to have high heat resistance. Accordingly, a polyimide film is preferably used as a flexible substrate for a compound semiconductor solar cell.

For example, Patent Document 1 discloses a method in which a flexible compound semiconductor solar cell is prepared by forming a metal layer and a compound semiconductor layer on a polyimide film having high heat resistance and high dimensional stability. Specifically, a method for preparing a polyimide film as a substrate is disclosed in which a polyimide precursor (polyamide acid) solution is applied onto a support base, and heated at 200° C. or lower to form a self-supporting gel film, and the gel film is separated from the support base, and then subjected to a heating treatment at about 500° C. under no stress.

Patent Document 1 discloses that generation of cracks in a metal layer serving as an electrode and a semiconductor layer, and peeling of these layers from the substrate can be suppressed, when the metal layer is formed on a polyimide film B-surface that is in contact with a support base in coating of the polyimide film, and a chalcopyrite compound semiconductor layer is formed on the metal layer. According to Patent Document 1, the reason for this is that B-surface that is in contact with a support base during coating of the film has a strong surface structure, since volatilization of a solvent hardly occurs on the B-surface as compared to an air-surface (A-surface) so that imidization of a polyamide acid easily proceeds on B-surface.

An alkali metal diffuses from a substrate into a compound semiconductor layer when a soda lime glass or the like is used as the substrate as described above, whereas it is necessary to add an alkali metal in a compound semiconductor layer when a polyimide substrate is used. Patent Document 1 (see paragraph [0119]) proposes a method in which an alkali metal-containing layer is formed on a metal electrode layer, and a compound semiconductor layer is formed thereon.

Patent Document 2 discloses insertion of a silicate layer of soda lime ($Na_2.CaO.5SiO_2$) or the like between a polyimide substrate and a metal layer. In this method, heating during formation of a compound semiconductor layer causes an alkali metal in the silicate layer to pass/diffuse through a metal electrode layer, and is added to the compound semiconductor layer.

PRIOR ART DOCUMENTS

Patent Documents

Patent Document 1: International Publication No. WO 2009/142244
Patent Document 2: International Publication No. WO 2009/116626

SUMMARY OF THE INVENTION

Problems to be Solved by the Invention

In the methods in Patent Document 1 and Patent Document 2, it is necessary to form an alkali metal-containing layer separately for the purpose of adding an alkali metal in a compound semiconductor layer. Thus, these methods have the problem that the number of process steps in manufacturing of a solar cell, leading to a reduction in manufacturing efficiency and an increase in production cost.

Means for Solving the Problems

The inventors have extensively conducted studies in view of the above-mentioned problems, and resultantly found that when a metal layer and a compound semiconductor layer are formed on a stacked body in which a polyimide film is formed on a specific base, a compound semiconductor layer may contain an alkali metal without providing an alkali metal-containing layer separately, and thus a high-efficiency compound semiconductor solar cell can be provided.

A solar cell according to the present invention includes a metal layer and a chalcopyrite compound semiconductor layer in this order on a polyimide film. The metal layer is provided on a polyimide film air-surface, the surface being an air-surface during coating of the polyimide film.

A method for manufacturing a solar cell according to the present invention includes an application step of cast applying a polyimide precursor solution onto a support base containing an alkali metal; a step of imidizing the polyimide precursor by heating to form a stacked body including a polyimide film on the support base; a step of forming a metal layer on the polyimide film of the stacked body; and a step of forming a chalcopyrite compound semiconductor layer on the metal layer, in this order. After the semiconductor layer formation step, the support base and the polyimide film may be separated from each other to obtain a flexible solar cell film.

The heating temperature in heat-imidization of the polyimide precursor is preferably 300° C. or more and 500° C. or less.

The formation temperature T during formation of the compound semiconductor layer is preferably higher than 500° C. The 1%-weight-reduction temperature Td1 of the polyimide film is preferably higher than the formation temperature T, more preferably higher than 560° C. For example, when an alkoxysilane-modified polyamide acid solution is used as the polyimide precursor solution, which is obtained by reacting an amino group-containing alkoxysilane compound and a polyamide acid in a solution, a polyimide film with a high Td1 is obtained.

The alkali metal contained in the support base is preferably sodium. As the support base, a soda lime glass is preferably used.

Effects of the Invention

According to the present invention, a polyimide precursor is heat-imidized on a support base containing an alkali metal, and consequently, the alkali metal in the support base moves into a polyimide film. Further, a metal layer and a compound semiconductor layer are formed on the stacked body of the support base and the polyimide film, and consequently, the alkali metal in the support base and the alkali metal in the polyimide film move to the compound semiconductor layer through the metal layer. Accordingly, a high-efficiency compound semiconductor solar cell using a polyimide substrate can be prepared without supplement of layer for adding an alkali metal and increase the number of process steps.

MODE FOR CARRYING OUT THE INVENTION

Figure 1A:
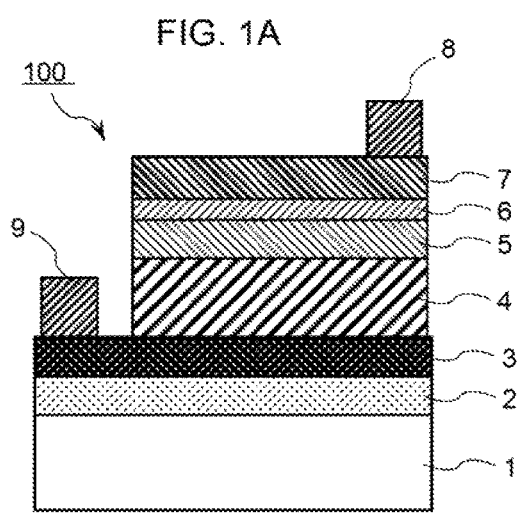
FIGS. 1A and 1B are schematic sectional views each showing an embodiment of a solar cell according to the present invention.
Figure 1B:
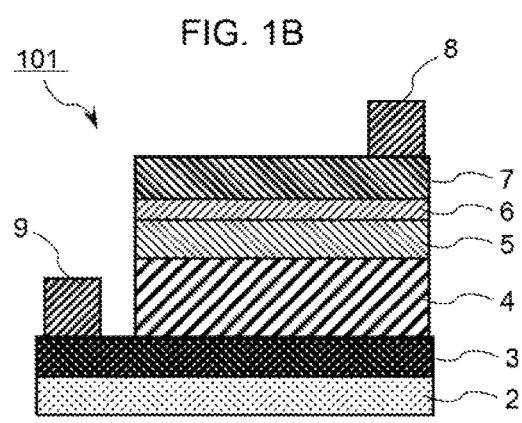

FIGS. 1A and 1B are schematic sectional views of a compound semiconductor solar cell according to an embodiment of a solar cell of the present invention. The solar cell 100 shown in FIG. 1A includes a polyimide film 2, a metal layer 3, a compound semiconductor layer 4, a buffer layer 5, a high-resistance layer 6 and a transparent electrode layer 7 in this order on one principal surface of a support base 1. In the configuration shown in FIG. 1A, extraction electrodes 8 and 9 are provided on the transparent electrode layer 7 and the metal layer 3, respectively. The solar cell 101 in FIG. 1B is obtained by separating the support base 1 from the solar cell 100 in FIG. 1A. In this specification, a solar cell after separation of a support base as shown in FIG. 1B is sometimes referred to as a "solar cell film".

Figure 2A:
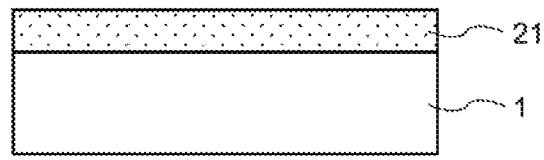
FIGS. 2A to 2E are conceptual process diagrams for explaining a process for manufacturing a solar cell.
Figure 2B:
Figure 2C:
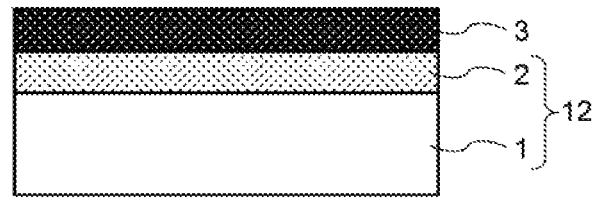
Figure 2D:
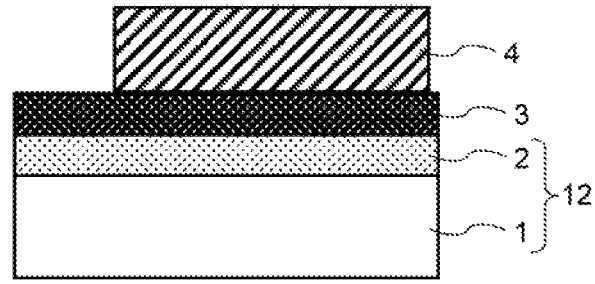

FIGS. 2A to 2E are conceptual diagrams showing one configuration of a process for manufacturing a solar cell according to the present invention. A polyimide precursor solution is cast applied onto the support base 1, and heated to dry the solvent as necessary, so that a polyimide precursor film 21 is formed on the support base 1 (FIG. 2A: application step). The polyimide precursor is heated to perform heat-imidization, so that a stacked body 12 including the polyimide film 2 is formed on the support base 1 (FIG. 2B: imidization step). The metal layer 3 is formed on the polyimide film 2 of the stacked body 12 (FIG. 2C: metal layer formation step), and the chalcopyrite compound semiconductor layer 4 is formed on the metal layer 3 (FIG. 2D: semiconductor layer formation step).

Figure 2E:
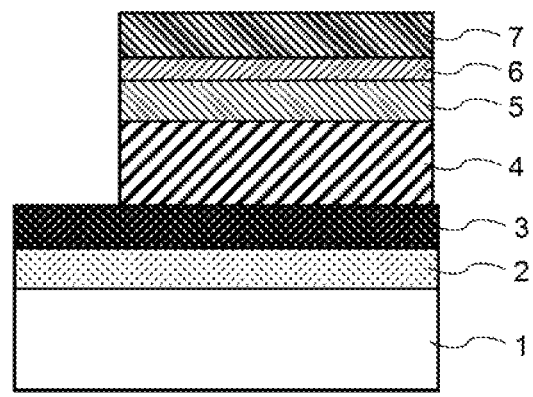

After formation of the metal layer 3, the buffer layer 5, the high-resistance layer 6, the transparent electrode layer 7 and so on are formed on the metal layer 3 to obtain a compound semiconductor solar cell (FIG. 2E). Thereafter, extraction electrodes 8 and 9 are formed as necessary. The support base 1 and the polyimide film 2 are separated from each other (separation step) to obtain a solar cell film 101 including the metal layer 3 and the compound semiconductor layer 4 on the polyimide film 2 as shown in FIG. 1B.

As the support base 1, one containing an alkali metal is used. As described later, alkali metal atoms in the support base 1 are included in the polyimide film 2 in formation of the polyimide film 2 on the support base 1, and further, alkali metal atoms are diffused to the compound semiconductor layer 4 during formation of the compound semiconductor layer 4. Accordingly, the alkali metal plays the role of compensating for defects of chalcopyrite, particularly defects caused by selenium desorption (so called an "alkali effect"), so that a high-efficiency solar cell is obtained.

Examples of the alkali metal include Li, Na, K, Rb, Cs and Fr. From the viewpoint of versatility and productivity of the solar cell, Na is preferable. The alkali metal content in the support base 1 is not particularly limited as long as the alkali metal can be diffused to the compound semiconductor layer 4. The alkali metal may be contained in the support base 1 in the form of a compound of an oxide etc.

When the alkali metal is contained in the support base in the form of an oxide, the content thereof is preferably 5% to 22%, more preferably 12% to 22% in terms of a mass percentage based on an oxide ($NaO_2$ or $KO_2$). When the content of the alkali metal is in a range as described above, diffusion of the alkali metal to the compound semiconductor layer 4 tends to be accelerated. The diffusion amount of the alkali metal from the support base depends not only on the alkali metal content in the support base 1, but also the material and thickness of the polyimide film (polyimide precursor), the heating temperature and so on.

The support base 1 should be capable of supporting thin-films such as the polyimide film 2, the metal layer 3, the compound semiconductor layer 4 and so on (layers 2 to 7) formed on the support base 1. The term "capable of supporting" indicates a state in which the support substrate itself is not warped or distorted even after formation of the solar cell. The support base 1 may be rigid, or flexible. When a rigid base such as a glass is used, use of a stacked body with a polyimide film formed on a glass base enables production by a process for a usual glass substrate. Accordingly, manufacturing efficiency of a flexible solar cell can be improved. As the support base 1, a soda lime glass is suitably used because it is inexpensive, and is easily handled.

A polyimide precursor solution is cast applied onto the support base 1, and heated and imidized (also referred to as "heat-imidized") to form the polyimide film 2, so that the stacked body 12 of the support base 1 and the polyimide film 2 is obtained. Here, it is preferable that the polyimide film 2 is formed on the support base 1 without interposing any other layer therebetween. When other layers (e.g., a silane coupling agent layer, a silicon oxide layer and so on) are formed on the support base 1 containing an alkali metal, these layers act as an alkali metal diffusion blocking layer, so that movement of the alkali metal from the support base 1 to the polyimide film 2 tends to be limited.

A polyamide acid as the polyimide precursor is obtained by reacting a diamine with a tetracarboxylic acid dianhydride in a solvent. For forming a polyimide excellent in heat resistance, it is preferable to obtain a polyamide acid by polymerizing an aromatic diamine and an aromatic tetracarboxylic acid.

As the aromatic tetracarboxylic acid dianhydride, 3,3',4,4'-biphenyltetracarboxylic dianhydride (BPDA) is preferable. As the aromatic diamine, ones having high linearity, such as paraphenylenediamine (PDA), benzidine and 4,4"-diaminoparaterphenyl (DATP), are preferable. Among these aromatic diamines, PDA and DATP are preferable because they are easily available. By using the above-mentioned aromatic tetracarboxylic acid dianhydride and aromatic diamine, a polyimide having high linearity, excellent heat resistance and low coefficient of thermal expansion (CTE) is obtained.

A tetracarboxylic acid dianhydride and a diamine other than those described above may be used within the bounds of not impairing the heat resistance and low CTE property of the polyimide. Examples of the aromatic tetracarboxylic acid dianhydride other than those described above include pyromellitic acid dianhydride, 3,3',4,4'-benzophenonetetracarboxylic acid dianhydride, 2,3,3',4'-biphenyltetracarboxylic acid dianhydride, 3,3',4,4-diphenylsulfonetetracarboxylic acid dianhydride, 1,4,5,8-naphthalenetetracarboxylic acid dianhydride, 2,3,6,7-naphthalenetetracarboxylic acid dianhydride, 1,2,5,6-naphthalenetetracarboxylic acid dianhydride, 4,4'-oxydiphthalic acid anhydride, 9,9-bis(3,4-dicarboxyphenyl)fluorine dianhydride, 9,9'-bis[4-(3,4-dicarboxyphenoxy)phenyl]fluorene dianhydride, 3,3',4,4'-biphenyl ether tetracarboxylic acid dianhydride, 2,3,5,6-pyridinetetracarboxylic acid dianhydride, 3,4,9,10-perylenetetracarboxylic acid dianhydride, 4,4'-sulfonyldiphthalic acid dianhydride, paraterphenyl-3,4,3',4'-tetracarboxylic acid dianhydride, metaterphenyl-3,3',4,4'-tetracarboxylic acid dianhydride, 3,3',4,4'-diphenyl ether tetracarboxylic acid dianhydride. The aromatic ring of the acid dianhydride may be substituted with an alkyl group, a halogen group or the like. Examples of the diamine other than those described above include 4,4'-diaminodiphenyl ether, 3,4'-diaminodiphenyl ether, 4,4'-diaminodiphenyl sulfone, 1,5-(4-aminophenoxy)pentane, 1,3-bis(4-aminophenoxy)-2,2-dimethylpropane, 2,2-bis(4-aminophenoxyphenyl)propane, bis[4-(4-aminophenoxy)phenyl]sulfone and bis[4-(3-aminophenoxy)phenyl]sulfone.

The 1%-weight-reduction temperature Td1 of the polyimide film is preferably higher than the formation temperature T of the compound semiconductor layer 4. The "1%-weight-reduction temperature" is a temperature at which the weight decreases by 1% based on the total weight at the time of elevating the temperature at a constant rate under a nitrogen gas atmosphere. Heat decomposition becomes harder to occur as the 1%-weight-reduction temperature Td1 increases. The 1%-weight-reduction temperature Td1 can be measured by thermogravimetric analysis (TGA).

As described later, the formation temperature T of the compound semiconductor layer is preferably higher than 500° C. for enhancing the efficiency of the solar cell by accelerating selenidation of a compound semiconductor and addition of sodium by diffusion. Accordingly, the 1%-weight-reduction temperature Td1 is preferably higher than 500° C., and the 1%-weight-reduction temperature Td1 is more preferably higher than 560° C. When the 1%-weight-reduction temperature Td1 is in a range as described above, heat decomposition of the polyimide during formation of the compound semiconductor layer is suppressed, and suppression of distortion of the film can be expected. Accordingly, occurrence of unevenness on the polyimide film tends to be reduced, leading to suppression of peeling between the polyimide film 2 and the support base 1, and peeling between the polyimide film 2 and the metal layer 3, the compound semiconductor layer 4 or the like. Accordingly, the conversion efficiency of the solar cell can be improved, and the yield during manufacturing of the solar cell can be improved.

For preparing a polyimide film having high heat resistance as described above, an alkoxysilane-modified polyamide acid is preferably used as the polyimide precursor. The alkoxysilane-modified polyamide acid is obtained by reacting an alkoxysilane compound with a polyamide acid in a solution.

As the alkoxysilane compound, one containing an amino group is preferably used. Examples of the alkoxysilane compound containing an amino group include 3-aminopropyltrimethoxysilane, 3-aminopropyltriethoxysilane, 3-aminopropylmethyldimethoxysilane, 3-aminopropylmethyldiethoxysilane, 3-(2-aminoethyl)aminopropyltrimethoxysilane, 3-phenylaminopropyltrimethoxysilane, 2-aminophenyltrimethoxysilane and 3-aminophenyltriethoxysilane.

The blending ratio of the alkoxysilane compound based on 100 parts by weight of the polyamide acid is preferably 0.01 to 0.5 parts by weight, more preferably 0.01 to 0.1 parts by weight. When the blending ratio of the alkoxysilane compound is 0.01 parts by weight or more, the heat resistance of the polyimide film is improved, and peeling of the polyimide film from the support base during heating tends to be suppressed. When the blending ratio of the alkoxysilane compound is 0.5 parts by weight or less, depolymerization of the polyamide acid is suppressed, and therefore the molecular weight can be retained, so that the problem of embrittlement of the polyimide film, etc. hardly to occurs.

The solvent of the polyimide precursor solution is not particularly limited as long as it is capable of dissolving the polyamide acid, and a solvent used for polymerization of the polyamide acid can be used as it is. The solvent may be removed or added as necessary after polymerization of the polyamide acid. An amide-based solvent such as N-dimethylformamide, N,N-dimethylacetamide or N-methyl-2-pyrrolidone is preferably used for polymerization of the polyamide acid. In place of the above-mentioned solvent, dimethylsulfoxide, hexamethylphospholide, acetonitrile, acetone, tetrahydrofuran or the like can be used as a solvent.

An imidization catalyst, inorganic fine particles and so on may be added to the polyimide precursor solution as necessary. As the imidization catalyst, a tertiary amine is preferably used, and particularly, heterocyclic tertiary amines such as pyridine, 2,5-diethylpyridine, picoline, quinoline and isoquinoline are preferable. As the inorganic fine particles, an inorganic oxide powder such as that of silicon dioxide (silica) or aluminum oxide, an inorganic salt powder such as that of calcium carbonate or calcium phosphate, or the like is used.

The polyimide precursor solution can be cast applied onto the support base 1 by a known cast coating method such as a gravure coating method, spin coating method, a silkscreen method, a dip coating method, a bar coating method, a knife coating method, a roll coating method or a die coating method. By heating and drying the applied solution as necessary, the polyimide precursor film 21 is formed on the support base 1 (FIG. 2A). Heating (temporary drying) for volatilizing the solvent is performed, for example, at a temperature of about 80 to 200° C. for about 3 to 120 minutes.

The polyimide precursor 21 on the support base 1 is heated to perform heat-imidization. In the present invention, heat-imidization is performed on the support base 1 containing an alkali metal to obtain the polyimide film 2 including an alkali metal. When an imidized polyimide film is merely bonded to an alkali metal base, alkali metal is not included in the polyimide film. It is therefore considered that in the present invention, an alkali metal heat-diffused from the support base 1 forms a salt with a carboxy group in the polyamide acid, so that the alkali metal is included in the polyimide film. Presence/absence and the content of an alkali metal in the polyimide film can be measured by, for example, secondary ion mass spectrometry (SIMS).

The heating temperature and the heating time in heat-imidization can be appropriately set to a range for proceeding heat-imidization. For efficiently performing heat-imidization and accelerating diffusion of an alkali metal from the support base 1 to the polyimide film 2, the heating temperature in heat-imidization is preferably 300° C. or higher, more preferably 400° C. or higher, further preferably 450° C. or higher, especially preferably 460° C. or higher. For suppressing heat degradation of the polyimide, the heating temperature in heat-imidization is preferably 500° C. or lower, more preferably 480° C. or lower.

Preferably, the temperature during heat-imidization is slowly elevated from a low temperature. The heating temperature in heat-imidization is the maximum temperature in the process. In this specification, the "temperature" during heat-imidization is a setting temperature (atmospheric temperature) in a heating apparatus. The "temperature" in steps other than heat-imidization means a substrate surface temperature measured by a heat radiation thermometer.

The thickness of the polyimide film 2 is preferably 5 μm to 50 μm, more preferably 10 μm to 20 μm. When the thickness of the polyimide film is 5 μm or more, a mechanical strength required as a flexible substrate can be secured, and peeling of the polyimide film from the support base due to, for example, heating during formation of the compound semiconductor layer 4 can be suppressed. When the thickness of the polyimide film is 20 μm or less, thickness unevenness of the film is reduced to improve the uniformity of the metal layer 3, the compound semiconductor layer 4 and so on formed on the film.

The metal layer 3 is formed on the polyimide film 2 of the stacked body 12 including the polyimide film 2 on the support base 1. In other words, the metal layer 3 is provided on the polyimide film A-surface, the surface being the air-surface during coating of the polyimide film. It is preferable that the metal layer 3 is formed so as to be in contact with the air-surface of the polyimide film 2. The metal layer 3 serves as a back electrode layer in a solar cell.

The material of the metal layer 3 is not particularly limited as long as it is a metal having high conductivity. A high-melting-point metal is preferable, and molybdenum is especially preferable. Molybdenum has high reactivity with selenium contained in CIS and CIGS, and is therefore effective in improving adhesion at the interface between the metal layer 3 and the compound semiconductor layer 4. As a method for forming the metal layer 3, a known method can be appropriately selected and employed. A vapor deposition method and a sputtering method are preferable because a metal layer having a large area can be uniformly and easily deposited.

The thickness of the metal layer 3 is preferably 0.2 to 1.0 μm, more preferably 0.3 to 0.6 μm. When the thickness of the metal layer 3 is in a range as described above, sufficient conductivity can be secured, and absorption of light under the influence of morphology of the surface of the metal layer can be suppressed. It is preferable that the thickness of the metal layer 3 is in a range as described above because diffusion of alkali metal atoms from the support base 1 and the polyimide film 2 is not hindered.

The compound semiconductor layer 4 is formed on the metal layer 3. In formation of the metal layer, it is preferable that the compound semiconductor layer 4 is formed so as to be in contact with the metal layer 3. The compound semiconductor layer 4 is a chalcopyrite type compound semiconductor layer. I-III-VI$_2$ type compound semiconductors, typically CIS(CuInSe$_2$) and CIGS(Cu(In,Ga)Se$_2$), are semiconductors in which group II atoms of the group II-VI semiconductor are replaced by group I atoms and group III atoms. The group I and III atoms may have a chalcopyrite (copper pyrite) structure in which atoms are regularly arranged, or a Sphalerite structure (zinc blende) structure in which atoms are irregularly arranged. In the present invention, a chalcopyrite structure is used. CIS and CIGS have a band gap of 1.04 to 1.68 eV, and their lattice constant is controlled to be within a range of 0.561 to 0.577 nm (Thin-Film Handbook, 2nd edition, edited by Japan Society for the Promotion of Science 131st Committee, page 380). In the CIS and CIGS, pn conductivity can be controlled by a composition ratio derived from a Cu/In ratio called an "intrinsic defect", and a compound solar cell including a CIS layer or a CIGS layer is considered to have good performance because it has p-type conductivity in which In holes and CuIn (anti-sites) serve as acceptor.

Among I-III-VI$_2$-type compound semiconductors, LMX$_2$-type compound semiconductors (L: Cu, Ag, M: Al, Ga, In; X: S, Se) can be preferably used for the compound semiconductor layer 4. Particularly, CIS or CIGS (hereinafter, sometimes referred to as a "CIS type") is preferable from the viewpoint of photoelectric conversion efficiency and costs. When CIGS is used, value of x in (In$_{1-x}$Ga$_x$) is preferably 0.15 to 0.50. When x is in this range, the transportation property of carriers and the wavelength range for photoelectric conversion can be sufficiently secured.

As the method for forming the compound semiconductor layer 4, either a wet method or a dry method is applicable. For example, in the wet method, a raw material in the form of nanoparticles can be applied, and subjected to firing and selenidation to form a CIS-type layer. In the dry method, a CIS-type layer can be formed by a sputtering method or vapor deposition method using a target having a composition of CIS etc., or a multi-source vapor deposition method using various components, respectively, as raw materials. Alternatively, sputtering deposition can be carried out using as a target a metal compound other than selenium in CIS or CIGS, followed by performing a selenidation treatment at a high temperature to form a CIS-type layer. When selenidation is performed, it is preferable that a heat treatment is performed at a temperature higher than 500° C. in an environment where selenium vapor or hydrogen selenide forms a surrounding atmosphere. A similar effect can be obtained by performing a sulfidation treatment using sulfur or hydrogen sulfide instead of the selenidation treatment.

The formation temperature T of the compound semiconductor layer 4 is preferably higher than 500° C. When the temperature T is higher than 500° C., diffusion of an alkali metal from the support base 1 and the polyimide film 2 to the compound semiconductor layer 4 is accelerated by heating during formation of the compound semiconductor layer, and owing to the alkali effect, a high-efficiency solar cell is obtained. Presence/absence and the content of an alkali metal in the compound semiconductor layer 4 can be measured by, for example, secondary ion mass spectrometry (SIMS).

More preferably, the formation temperature T of the compound semiconductor layer 4 satisfies the relationship of 500° C.<T<560° C. The formation temperature T is preferably higher than 500° C. and lower than Td1. When the formation temperature T is lower than Td1, heat decomposition of the polyimide film 2 is suppressed, and defects such as peeling due to distortion of the film can be suppressed. The formation temperature T is the maximum temperature during formation of the compound semiconductor layer 4. Generally, in formation of a CIS-type layer, the temperature during selenidation is the maximum temperature. Specifically, in a wet process, the temperature during firing and selenidation after application is the formation temperature T, and when selenidation is performed in a dry process, the temperature during selenidation is the formation temperature T.

The thickness of the compound semiconductor layer 4 is preferably 1 to 8 μm, more preferably 2 to 5 μm. When the thickness of the compound semiconductor layer is in a range as described above, recombination of carriers caused by irradiation of light can be suppressed to efficiently extract the carriers to an electrode.

The transparent electrode layer 7 as an electrode on the light-receiving side is formed on the compound semiconductor layer 4 to obtain a compound semiconductor solar cell. Preferably, the compound semiconductor solar cell includes the buffer layer 5 and the high-resistance layer 6 between the compound semiconductor layer 4 and the transparent electrode layer 7. The solar cell according to the present invention is not limited to a configuration as shown in FIG. 1A, and may have another layer between the compound semiconductor layer 4 and the transparent electrode layer 7.

As a material of the buffer layer 5, one suitable as a buffer layer in a CIS-type solar cell, such as CdS, ZnSe, ZnMgO, Zn(O, S), Zn(Se, OH), $ZnIn_2Se_4$, In(OH, S), $In_2S_3$, $SnO_2$ or Sn(O,S) can be used without limitation. Particularly, the buffer layer 5 including a compound containing Cd, Zn and In is preferable for enhancement of efficiency.

The method for forming the buffer layer 5 is not particularly limited, and wet methods such as a CBD method, vacuum vapor deposition, sputtering methods, atomic layer deposition methods, ionic layer gas reaction methods, organic metal vapor growth methods (MO-CVD method and LP-CVD method), and the like are applicable. Among them, wet methods are preferable, and a CBD method is especially preferable because the highest conversion efficiency can be achieved.

The thickness of the buffer layer 5 is preferably 10 to 200 nm, more preferably 20 to 100 nm. When the thickness of the buffer layer is in a range as described above, an increase in series resistance and absorption of light by the buffer layer are suppressed, and the carrier transportation property by formation of a p/n junction with the compound semiconductor layer can be improved.

Preferably, the high-resistance layer 6 is formed on the buffer layer 5. As the material of the high-resistance layer 6, high-resistance metal oxides such as ZnO and ZnMgO are preferably used. The high-resistance layer 6 serves to prevent generation of a shunt path in the buffer layer 5 which is locally thinned near the crystal grain boundary. When a high-resistance layer is provided, an effect of compensating for local unevenness (film composition and crystallographic defects) of the CIS-type layer to suppress a reduction in open circuit voltage can be expected. The thickness of the high-resistance layer 6 is preferably 10 nm to 100 nm, more preferably 50 to 75 nm.

As a method for forming the high-resistance layer 6, a physical vapor deposition method such as a sputtering method, or a CVD method is preferable. It is preferable to deposit the high-resistance layer by a same method for depositing the transparent electrode layer 7 as described later.

For the transparent electrode layer 7, for example, zinc oxide, indium oxide, tin oxide and the like can be used alone, or used in mixture. It is preferable to add a conductive dopant to these oxides for improving conductivity. For example, aluminum, gallium, boron, silicon, carbon or the like can be added to zinc oxide. Zinc, tin, titanium, tungsten, molybdenum, silicon or the like can be added to indium oxide. Fluorine or the like can be added to tin oxide. The conductive oxide layer may be a single layer, or may have a stacking configuration.

As a method for depositing the transparent electrode layer 7, a physical vapor deposition method such as a sputtering method, a CVD method or the like is preferable. In any deposition method, energy from heat or plasma discharge can be used. For example, when zinc oxide is deposited by a LP-CVD method, a reaction of diethyl zinc with water or oxygen can be used. By reacting these materials under a vacuum atmosphere, a transparent electrode layer can be formed. Further, a hydrogen gas or the like may be fed for stabilizing the temperature in the vacuum atmosphere.

Here, the "vacuum atmosphere" means a state in which an unintended gas in the reaction system is removed to a desired pressure using a vacuum pump etc., or a state in which a desired gas is introduced into the system within a pressure range that is not above the atmospheric pressure. By introducing a doping gas along with the above-mentioned material, conductive doping can be performed. For example, when zinc oxide is used as a transparent electrode layer, conductive doping can be performed by feeding diborane or the like as a doping gas.

The thickness of the transparent electrode layer 7 is preferably 10 nm to 140 nm for securing both transparency and conductivity. When the thickness of the transparent electrode layer is increased when it is formed by a LP-CVD method, irregularities are formed on the surface of the transparent electrode layer due to crystal growth of the metal oxide, so that the effect of confinement of light in the solar cell is improved. Accordingly, the thickness of the transparent electrode layer 7 when it is formed by a LP-CVD method is preferably 1.0 μm to 2.0 μm.

Preferably, the extraction electrode 8 is formed on the transparent electrode layer 7. The extraction electrode 8 can be formed by a vapor deposition method, an inkjet method, screen printing, conductor bonding, spraying or the like. For the extraction electrode, any metal can be arbitrarily used as long as the metal has high conductivity. For example, silver, aluminum, gold or the like can be suitably used. As shown in FIG. 1A and FIG. 1B, the extraction electrode 9 may be formed on the metal layer 3 as a back electrode.

When the extraction electrode is formed using a conductive paste, the transparent electrode layer may be annealed also for the purpose of solidifying the paste. By annealing, enhancement of the transparency and reduction of the resistance of the transparent electrode layer are achieved, and an effect of reducing the contact resistance and interface level, for example, can be expected as well.

The solar cell according to the present invention can be put to practical use with the metal layer 3, the compound semiconductor layer 4 and so on formed on the support base 1 with the polyimide film 2 interposed therebetween as shown in FIG. 1A. When the polyimide film is used as a flexible solar cell film, it is preferable that the support base 1 and the polyimide film 2 are separated from each other.

The method for separating the polyimide film 2 from the support base 1 is not particularly limited. For example, the film may be separated by hands, or separated using a machinery such as a driving roll or a robot. After formation of the compound semiconductor layer 4, i.e., after diffusion and movement of the alkali metal from the support base 1 and the polyimide film 2 to the compound semiconductor layer 4, the support base 1 and the polyimide film 2 may be separated from each other before formation of the buffer layer, the high-resistance layer, the transparent electrode layer and so on.

For the purpose of, for example, protecting the surface of the solar cell and preventing ingress of moisture, a protecting layer (not illustrated) may be provided on the transparent electrode layer 7. The protecting layer may be provided either before or after separation of the support base. The protecting layer may also be provided on the B-surface of the polyimide film 2 (surface that is in contact with the support base during coating of the polyimide) after separation of the support base 1.

The solar cell according to the present invention, which is obtained in the manner described above, is applicable to various uses including indoor and outdoor uses. When the solar cell is installed outdoors, it may be installed on the roof, outer wall or the like of a building, and can also be installed on a curved surface of a vinyl house etc. When the solar cell is applied to a low-light-concentration-type solar cell in which light in a wide irradiation range is concentrated to the solar cell using a mirror, the solar cell is made to have a curved surface conforming to the shape of the mirror, so that reflected light from the mirror can be made vertically incident to the solar cell, and therefore the power generation amount can be increased.

The solar cell according to the present invention is light and flexible, and therefore when the solar cell is installed on the roof, outer wall or the like of a building, a solar cell can be additionally introduced without strengthening a stand etc., and the solar cell can be installed along the curved surface of an arch-shaped roof etc. Since the solar cell is light, the solar cell has a reduced burden on the structure even when installed on the outer wall surface or the like of a building, and secondary disaster caused by the solar cell installed on the wall surface can be reduced even if the building is collapsed in disaster etc. The solar cell according to the present invention is applicable to on-vehicle uses, mobile devices, wearable terminals and so on owing to the advantage of being light and flexible.

EXAMPLES

Hereinafter, the present invention will be described more in detail by showing examples, but the present invention is not limited to the following examples.

[Example of Formation of Polyimide Film on Glass Base]

In the following experimental examples, studies were conducted on a difference between the results of heat-imidization performed with a polyimide precursor film formed on a support base containing an alkali metal and heat-imidization performed after separation of a polyimide precursor from a support base.

(Preparation of Alkoxysilane-Modified Polyamide Acid Solution)

8500 g of dehydrated N,N-dimethylacetamide (DMAc) and 40.31 g of paraphenylenediamine (PDA) were added in a glass separable flask provided with stirrer with a polytetrafluoroethylene seal cap, a stirring blade and a nitrogen inlet tube. The solution was stirred for 30 minutes under a nitrogen atmosphere while being heated at 50° C. in an oil bath. After it was confirmed that the raw material was uniformly dissolved, 109.41 g of 3,3',4,4'-biphenyltetracarboxylic acid dianhydride (BPDA) was added, the mixture was stirred under a nitrogen atmosphere for 10 minutes until the raw material was completely dissolved, and the temperature of the solution was adjusted to about 80° C. The solution was continuously stirred for 3 hours while being heated, 153.8 g of DMAc was further added, and the mixture was stirred to obtain a polyamide acid solution having a viscosity of 25 Pa·s at 23° C.

The polyamide acid solution was cooled in a water bath, the temperature of the solution was adjusted to about 50° C., 7.50 g of a 1% DMAc solution of 3-aminopropyltriethoxysilane (γ-APS) was then added, and the mixture was stirred for 5 hours. By adding DMAc, the solution was diluted to have viscosity of 13.7 Pa·s at 23° C. In this way, an alkoxysilane-modified polyamide acid solution (polyimide precursor solution) was obtained. The blending amount (added amount) of the alkoxysilane compound (γ-APS) was 0.050 parts by weight based on 100 parts by weight of the polyamide acid.

Experimental Example 1

A polyimide precursor solution was temporarily dried on a support base, and then heat-imidized without being separated from the support base. Specifically, a 2 mm-thick soda lime glass ($Na_2O$ content: 12 to 16%) was provided as a support base, and the polyimide precursor solution was applied onto the soda lime glass by a bar coating method, and preheated (temporarily dried) at 80° C. Thereafter, the applied solution was heated to 480° C. under an air atmosphere to be heat-imidized, and was then slowly cooled to room temperature to obtain a stacked body with a 12 μm-thick polyimide film formed on a soda lime glass support base.

The polyimide film was separated from the stacked body, and the weight reduction ratio was measured by a thermogravimetric analysis (TGA) apparatus while the polyimide film was heated at a temperature elevation rate of 10° C./minute under the flow of a nitrogen gas. The result showed that the weight reduction ratio in elevation of the temperature to 560° C. was less than 1%. Accordingly, the 1%-weight-reduction temperature Td1 of the polyimide film was confirmed to be higher than 560° C.

Experimental Example 2

The steps up to temporary drying were carried out in the same manner as in Experimental Example 1, and the polyimide precursor film was separated from the support base. The polyimide precursor film was bonded onto a non-alkali glass, and heated to 480° C. to be heat-imidized.

Experimental Example 3

With the non-alkali glass used as the support base, temporary drying was performed in the same manner as in Experimental Example 1, and the polyimide precursor film was then separated from the support base. The polyimide precursor film was bonded onto a soda lime glass similar to that used in Experimental Example 1, and heated to 480° C. to be heat-imidized on the soda lime glass.

Conditions for preparation of the samples (the types of bases during temporary drying and heat-imidization) and results of visually observing the color of the polyimide film after imidization in Experimental Examples 1 to 3 are shown in Table 1. The polyimide precursor film after temporary drying and before heat-imidization was light brown and transparent.

TABLE 1

| | Support base during temporary drying | Separation after temporary drying | Support base during heat-imidization | External appearance of polyimide |
|---|---|---|---|---|
| Experimental Example 1 | Soda lime glass | Not done | Soda lime glass | Dark brown |
| Experimental Example 2 | Soda lime glass | Done | Non-alkali glass | Light brown |
| Experimental Example 3 | Non-alkali glass | Done | Soda lime glass | Brown |

When a polyimide contains an alkali metal, the color tends to be turned darker. As shown in Table 1, the polyimide film of Experimental Example 1 in which the polyimide precursor solution was applied, and heat-imidized on the soda lime glass has the darkest color, and thus may have the highest alkali metal concentration (see Example 1 in FIG. 3). On the other hand, the polyimide film of Experimental Example 2 in which after the precursor solution was applied and temporarily dried, the precursor film was separated from the soda lime glass, bonded to the non-alkali glass, and heat-imidized has a low alkali metal content. From these results, it is apparent that movement of the alkali metal from the support base to the polyimide film occurs principally in heat-imidization. It can be understood that the polyimide film of Experimental Example 3 in which the polyimide precursor solution was applied and temporarily dried on the non-alkali glass, and heat-imidized on the soda lime glass has a darker color, and hence a higher alkali metal concentration than the polyimide film of Experimental Example 2. This result shows that movement of the alkali metal to the polyimide film from the support base containing the alkali metal occurs in heat-imidization.

Comparison between Experimental Example 1 and Experimental Example 3 shows that the polyimide film of Experimental Example 1 in which the precursor solution was applied and imidized consistently on the soda lime glass has a darker color, and a higher alkali metal concentration. This may be because in Experimental Example 1, the polyimide film is in contact with the alkali metal-containing support base in a heated state for a longer time, and is not separated after temporary drying, and therefore adhesion between the support base and the polyimide film is high, so that movement of the alkali metal from the support base to the polyimide film easily occurs.

[Example of Preparation of Flexible Solar Cell Film]

Based on the above-described results, solar cell films were prepared in the following examples using a polyimide film obtained by performing temporary drying and heat-imidization on a soda lime glass.

Example 1

The stacked body of a support base and a polyimide film obtained in Experimental Example 1 was introduced into a sputtering apparatus, and a 600 nm-thick Mo metal layer was deposited on the polyimide film in an argon atmosphere using a Mo target. In the initial stage of the deposition, the metal layer was deposited with a thickness of 50 nm under the conditions of substrate temperature: room temperature, pressure: 1 Pa, and input power density: 13.2 W/cm$^2$. Thereafter, the metal layer was deposited to the total thickness with the conditions changed to pressure: 0.6 Pa, and input power density: 8.8 W/cm$^2$.

Next, a CIGS layer was formed on the Mo metal layer with a thickness of 2.5 μm by a multi-source vapor deposition method using Cu, In, Ga and Se as independent vapor deposition sources. The maximum attained temperature during formation of the CIGS layer was about 530° C.

The substrate with a polyimide film, a Mo metal layer and a CIGS layer formed on a glass base was immersed in a 67° C. solution containing $CdSO_4$ (2.0 mM), $CH_4N_2S$ (50 mM) and $NH_{3aq}$ (1.5 M), and a 50 nm-thick cadmium sulfide layer as a buffer layer was formed on the CIGS layer by a CBD method. The substrate was immersed in pure water to be cleaned, and then dried by air blowing.

The substrate after formation of the buffer layer was introduced into a CVD apparatus, and on the buffer layer, a high-resistance zinc oxide layer (non-doped zinc oxide layer) was deposited by a LP-CVD method to have a thickness of 75 nm as a high-resistance layer. The high-resistance zinc oxide layer was deposited under the conditions of substrate temperature: 100° C., pressure: 400 Pa, diethyl zinc/$H_2O$ flow rate ratio: 7/5. The above-mentioned flow rate of each of diethyl zinc and $H_2O$ is the flow rate of a gas in which an argon gas as a carrier gas is bubbled into each raw material.

After formation of the high-resistance layer, a $B_2H_6$ gas was introduced into a deposition chamber, and a zinc oxide transparent electrode layer was deposited with a thickness of 1 μm. The deposition conditions for the transparent electrode layer were the same as the deposition conditions for the high-resistance zinc oxide layer except that the diethyl zinc/$H_2O$/$B_2H_2$ flow rate ratio was 7/5/0.13.

Finally, an extraction electrode was formed on each of the transparent electrode layer and the Mo metal layer. A 250 nm-thick Al layer was formed on the transparent electrode layer by a vapor deposition method. An electrode was formed on the Mo metal layer using an Ag paste.

In this way, a CIGS solar cell (FIG. 1A) including a metal layer, a CIGS layer, a buffer layer, a high-resistance layer and a transparent electrode layer on a soda lime glass support base with a polyimide film interposed between the support base and the metal layer was prepared. The soda lime glass and the polyimide film were separated from each other to obtain a flexible solar cell (FIG. 1B).

The thickness in this example was determined by observation of the cross-section of a solar cell with a scanning electron microscope (JSM-7001F manufactured by JEOL Ltd.). The substrate temperature during formation of the CIGS layer was measured by a heat radiation thermometer (FTZ6-P300-50k22 manufactured by Japan Sensor Corporation). The temperature in other steps is a setting temperature in each heating device.

Reference Example 1

In Reference Example 1, a solar cell was prepared in the same manner as in Example 1 except that a polyimide film was not formed on a soda lime glass. Specifically, a Mo metal layer was formed directly on the soda lime glass used as the support base in Example 1, and a CIGS layer, a buffer layer, a high-resistance layer and a transparent electrode layer were formed on the soda lime glass.

Comparative Example 1

In Comparative Example 1, a solar cell was prepared in the same manner as in Example 1 except that in place of the soda lime glass, a non-alkali glass was used as the support base.

[Evaluation]

Figure 3:
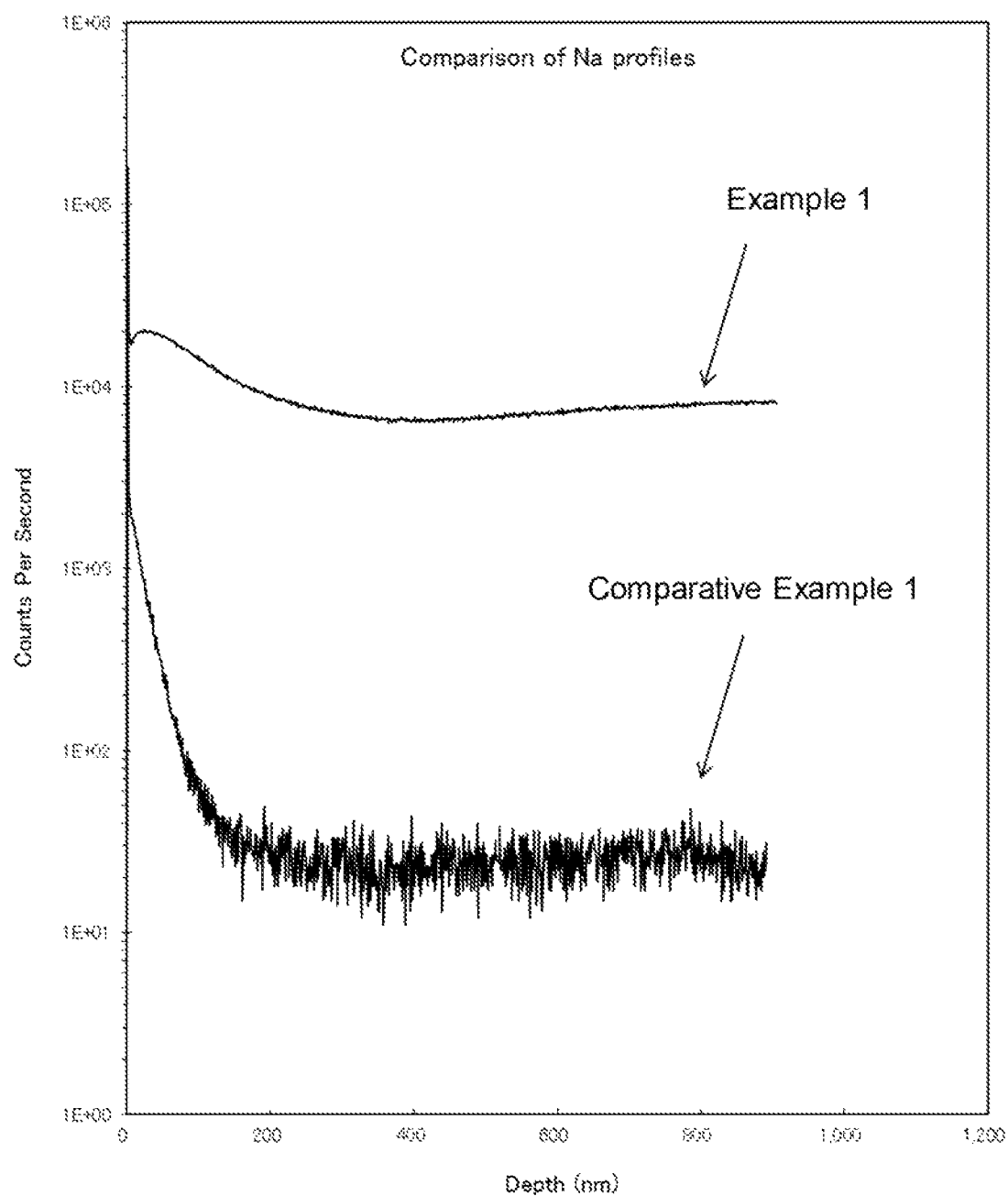
FIG. 3 shows results of SIMS analysis of (heat-imidized) polyimide films used for formation of solar cells in the Example and Comparative Example.

The photoelectric conversion properties of the solar cells of the Example, Comparative Example and Reference Example were evaluated using a solar simulator. The short circuit current density (Jsc), the open circuit voltage (Voc), the fill factor (FF) and the conversion efficiency ($\eta$) are shown in Table 2. Na content thickness-direction profile obtained by SIMS analysis (ADEPT1010 manufactured by PhysicalElectronics Company) over a range of about 1 µm from the A-surface of the polyimide film (after heat-imidization and before formation of the metal layer) used in each of Example 1 and Comparative Example 1 is shown in FIG. 3.

TABLE 2

|  | Support base | Substrate | Jsc (mA/cm$^2$) | Voc (V) | FF | $\eta$ (%) |
|---|---|---|---|---|---|---|
| Example 1 | Soda lime glass | Polyimide film | 34.5 | 0.646 | 0.718 | 16.0 |
| Reference Example 1 | Soda lime glass |  | 34.4 | 0.638 | 0.736 | 16.2 |
| Comparative Example 1 | Non-alkali glass | Polyimide film | 35.2 | 0.416 | 0.486 | 7.1 |

The solar cell of Example 1 in which the above-mentioned layers between the metal layer and the transparent electrode layer inclusive were formed on the stacked body of the soda lime glass and the polyimide film showed a conversion efficiency comparable to that of the solar cell of Reference Example 1 in which the above-mentioned layers between the metal layer and the transparent electrode layer inclusive were formed on the soda lime glass.

On the other hand, the solar cell of Comparative Example 1 in which a non-alkali glass was used as the support base, and the above-mentioned layers between the metal layer and the transparent electrode layer inclusive were formed on the stacked body of the non-alkali glass and the polyimide film had a considerably reduced conversion efficiency. From the results of SIMS in FIG. 3, it is considered that Na atoms in the support base were included in the polyimide film in heat-imidization of the polyimide precursor, and thus exposed under a high temperature during formation of CIGS, so that Na was heat-diffused from the polyimide film itself to the CIG-type semiconductor layer.

From the above results, it has become apparent that when a polyimide is heat-imidized and formed on a support base containing an alkali metal, a solar cell exhibiting good properties can be prepared without requiring an alkali metal introduction layer.

LIST OF REFERENCE CHARACTERS 1 support base
2 polyimide film
21 polyimide precursor film
3 metal layer
4 compound semiconductor layer
5 buffer layer
6 high-resistance layer
7 transparent electrode layer
8, 9 extraction electrode
100 solar cell
101 solar cell film

The invention claimed is:

1. A method for manufacturing a compound semiconductor solar cell, the compound semiconductor solar cell including a metal layer and a chalcopyrite compound semiconductor layer in this order on a polyimide film, the method comprising the following steps in the order:
an application step of cast applying a polyimide precursor solution onto a support base containing an alkali metal;
an imidization step of imidizing the polyimide precursor solution by heating to form a stacked body including the polyimide film on the support base, the alkali metal being heat-diffused from the support base into the polyimide film during the heating so that the alkali metal from the support base is included in the polyimide film;
a metal layer formation step of forming the metal layer on the polyimide film of the stacked body, the metal layer physically contacting the polyimide film; and
a semiconductor layer formation step of forming the chalcopyrite compound semiconductor layer on the metal layer, the alkali metal being diffused from the polyimide film to the chalcopyrite compound semiconductor layer through the metal layer during the semiconductor layer formation step.

2. The method for manufacturing a compound semiconductor solar cell according to claim 1, wherein a formation temperature T of the chalcopyrite compound semiconductor layer in the semiconductor layer formation step is higher than 500° C. and lower than 560° C.

3. The method for manufacturing a compound semiconductor solar cell according to claim 1, wherein a 1%-weight-reduction temperature Td1 of the polyimide film is higher than a formation temperature T of the chalcopyrite compound semiconductor layer in the semiconductor layer formation step.

4. The method for manufacturing a compound semiconductor solar cell according to claim 1, wherein the polyimide precursor solution is an alkoxysilane-modified polyamide acid solution obtained by reacting an amino group-containing alkoxysilane compound and a polyamide acid in a solution.

5. The method for manufacturing a compound semiconductor solar cell according to claim 1, wherein a heat temperature in the imidization step is 300° C. or more and 500° C. or less.

6. The method for manufacturing a compound semiconductor solar cell according to claim 1, wherein the alkali metal contained in the support base is sodium.

7. The method for manufacturing a compound semiconductor solar cell according to claim 6, wherein the support base is a soda lime glass.

8. The method for manufacturing a compound semiconductor solar cell according to claim 1, wherein the metal layer is molybdenum.

9. The method for manufacturing a compound semiconductor solar cell according to claim 1, wherein in the semiconductor layer formation step, a buffer layer is formed on the chalcopyrite compound semiconductor layer by a wet method.

10. The method for manufacturing a compound semiconductor solar cell according to claim 1, wherein the method further includes a separation step of separating the support base and the polyimide film from each other, after the semiconductor layer formation step.

* * * * *